United States Patent
Michiue

(10) Patent No.: US 9,252,323 B2
(45) Date of Patent: Feb. 2, 2016

(54) METHOD FOR MANUFACTURING NITRIDE SEMICONDUCTOR ELEMENT

(71) Applicant: NICHIA CORPORATION, Anan-shi (JP)

(72) Inventor: Atsuo Michiue, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/670,106

(22) Filed: Mar. 26, 2015

(65) Prior Publication Data

US 2015/0280055 A1    Oct. 1, 2015

(30) Foreign Application Priority Data

Mar. 28, 2014    (JP) ................ 2014-068383

(51) Int. Cl.
*H01G 9/20* (2006.01)
*H01L 33/00* (2010.01)
*H01L 33/18* (2010.01)

(52) U.S. Cl.
CPC .............. *H01L 33/007* (2013.01); *H01L 33/18* (2013.01)

(58) Field of Classification Search
CPC .............................. H01L 33/007; H01L 33/18
USPC ........................................................... 438/497
See application file for complete search history.

(56) References Cited

U.S. PATENT DOCUMENTS 6,191,437 B1    2/2001    Sonobe et al.
2002/0155682 A1    10/2002    Shibata et al.

FOREIGN PATENT DOCUMENTS

JP    2003-218045    7/2003
WO    WO 99/38218    7/1999

*Primary Examiner* — Matthew Gordon
(74) *Attorney, Agent, or Firm* — Foley & Lardner LLP

(57) ABSTRACT

A first nitride semiconductor layer laminating step includes a first step and a second step. In the first step, an entire upper surface of the sapphire substrate is coated with a first nitride semiconductor layer, while supplying oxygen. In the second step, crystals of the first nitride semiconductor layer are grown by supplying oxygen at a smaller flow rate than that of oxygen supplied in the first step, or without supplying the oxygen.

6 Claims, 5 Drawing Sheets

METHOD FOR MANUFACTURING NITRIDE SEMICONDUCTOR ELEMENT

CROSS-REFERENCE TO RELATED APPLICATIONS

The present application claims priority under 35 U.S.C. §119 to Japanese Patent Application No. 2014-068383, filed on Mar. 28, 2014. The content of this application is incorporated herein by reference in its entirety.

BACKGROUND OF THE INVENTION

1. Field of the Invention

The disclosure relates to a method for manufacturing a nitride semiconductor element.

2. Description of Related Art

A manufacturing method of a nitride semiconductor element is disclosed in WO 99/38218 as a conventional method. The manufacturing method of the nitride semiconductor element involves sequentially laminating a buffer layer of a gallium nitride compound semiconductor on a substrate at low temperature, and a light emission layer of a gallium nitride compound semiconductor over the buffer layer at high temperature, by a metal organic chemical vapor deposition. In growing the buffer layer, oxygen is supplied to stably grow the buffer layer.

In the conventional manufacturing method of the nitride semiconductor element, however, the temperature for growing the buffer layer is a low temperature, which leads to the formation of the grown buffer layer not in a single crystal state, but in a polycrystalline state close to an amorphous state. For this reason, the crystallinity of the nitride semiconductor layer formed over the buffer layer has room for improvement.

SUMMARY OF THE INVENTION

Accordingly, it is an object of an embodiment of the present invention to provide a method for manufacturing a nitride semiconductor element that can improve the crystallinity of a nitride semiconductor layer.

In order to solve the foregoing problems, a method for manufacturing a nitride semiconductor element according to one aspect of the present invention includes:
  a step of laminating a first nitride semiconductor layer of single crystals of $Al_xGa_{1-x}N$ ($0.5<X\leq1$) on an upper surface of a sapphire substrate by a metal organic chemical vapor deposition; and
  a step of laminating a second nitride semiconductor layer on the first nitride semiconductor layer,
wherein:
  the step of laminating the first nitride semiconductor layer includes
  a first step of coating an entire upper surface of the sapphire substrate with an under nitride semiconductor layer while supplying oxygen, and
  a second step of growing an upper nitride semiconductor layer while supplying oxygen at a smaller flow rate than that of oxygen supplied in the first step, or without supplying oxygen.

Accordingly, in the method for manufacturing a nitride semiconductor element in the one aspect of the present invention, the first step of the first nitride semiconductor layer laminating step involves supplying oxygen, and thus can stably grow the first nitride semiconductor layer having +c polarity. Further, the second step of the first nitride semiconductor layer laminating step involves reducing the flow rate of oxygen supplied, or setting the flow rate to zero, and thus can improve the crystallinity of the first nitride semiconductor layer.

DETAILED DESCRIPTION OF THE INVENTION

Embodiments shown in the accompanying drawings will be described in more detail below.

Figure 1:
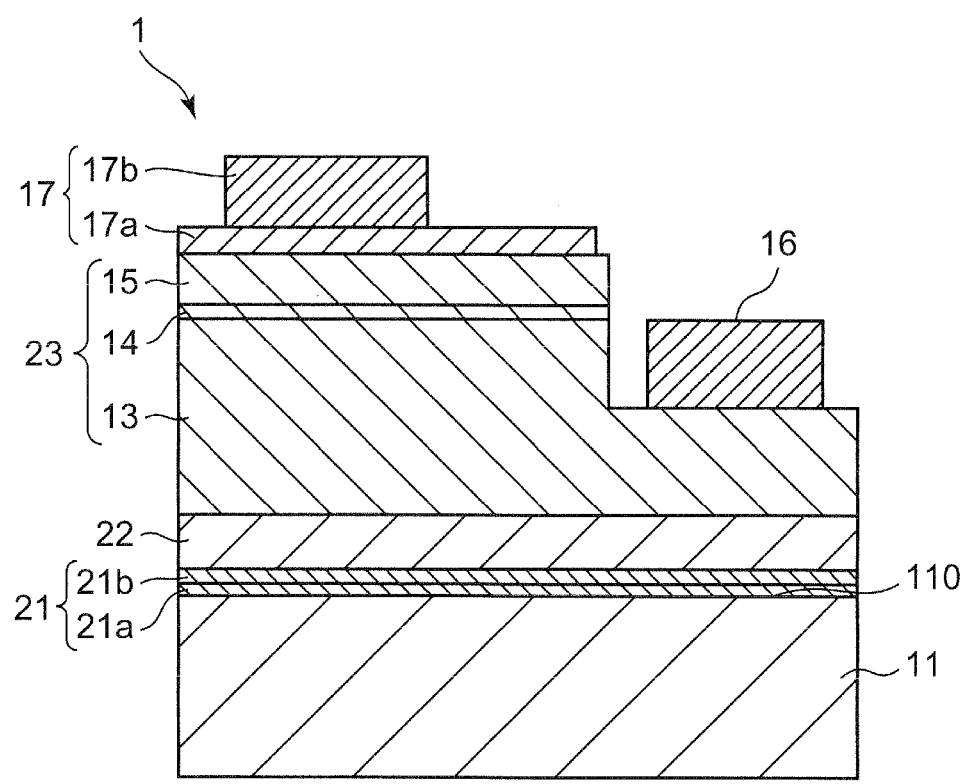
FIG. 1 is a schematic cross-sectional view showing the structure of a nitride semiconductor element according to one embodiment of the present invention.

FIG. 1 is a cross-sectional view showing a nitride semiconductor element according to one embodiment of the present invention. As shown in FIG. 1, a nitride semiconductor element 1 includes a sapphire substrate 11, a first nitride semiconductor layer 21 laminated on the sapphire substrate 11, a second nitride semiconductor layer 22 laminated on the first nitride semiconductor layer 21, and a third nitride semiconductor layer 23 laminated on or over the second nitride semiconductor layer 22. The first nitride semiconductor layer includes an under nitride semiconductor layer 21a and an upper nitride semiconductor layer 21b. The third nitride semiconductor layer 23 includes at least an n-type semiconductor layer 13, a light emission layer 14, and a p-type semiconductor layer 15 in that order from the side of the sapphire substrate. The third nitride semiconductor layer 23 has a region from which the n-type semiconductor layer 13 is exposed (hereinafter referred to as an exposed region) by removing parts of the light emission layer 14 and p-type semiconductor layer 15. The exposed region of the n-type semiconductor layer 13 is provided with an n-side electrode 16, while the upper surface of the p-type semiconductor layer 15 is provided with a p-side electrode 17.

Figure 2A:
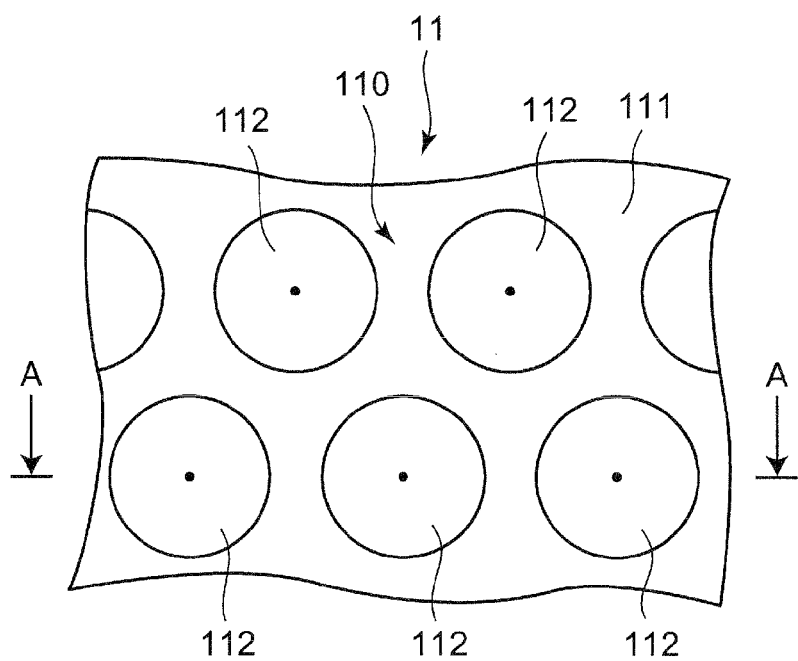
FIG. 2A is a schematic plan view showing the structure of a sapphire substrate in the one embodiment of the present invention.
Figure 2B:
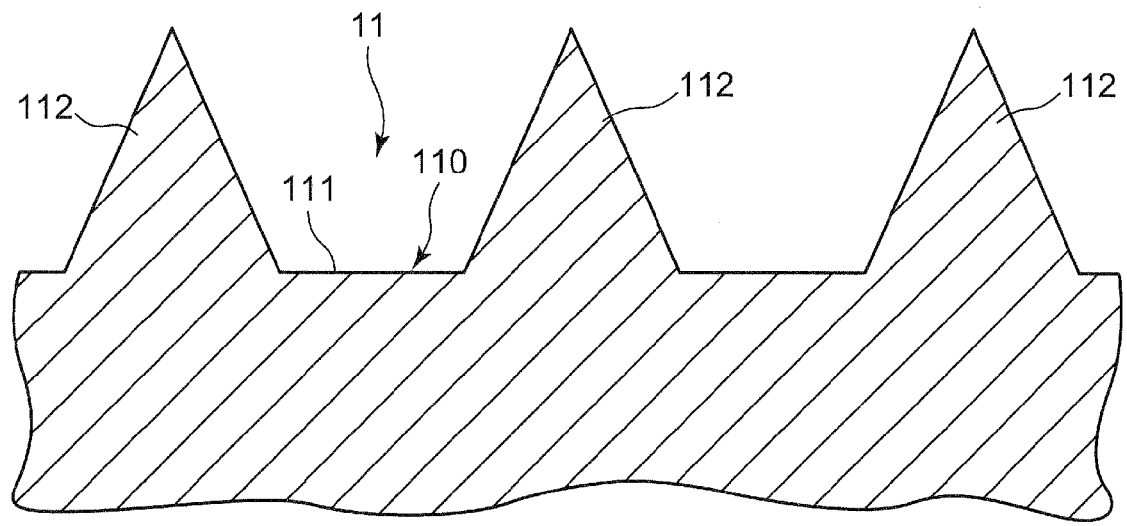
FIG. 2B is a schematic view showing the structure of the sapphire substrate in the one embodiment of the present invention, specifically, a cross-sectional view taken along the line A-A of FIG. 2A.

As shown in FIGS. 2A and 2B, the sapphire substrate 11 includes on its surface (upper surface) 110 on the side of lamination of the first nitride semiconductor layer 21, a plurality of protrusions 112, and a flat surface 111 formed of a c-plane disposed around the protrusions 112. The protrusion 112 preferably has a cone shape with its button surface having hexagonal symmetry because the GaN crystal structure of the second nitride semiconductor layer 22 has hexagonal symmetry as will be mentioned later. For example, the protrusion 112 may have a substantially conical shape like this embodiment, and further may have a substantially hexagonal pyramid with respective sides thereof in substantially parallel with crystal surfaces of the sapphire (e.g., a-surface and m-surface). Note that the protrusions 112 may not be provided on the upper surface 110 of the sapphire substrate 11.

The first nitride semiconductor layer 21 is a buffer layer of a single crystal formed by the metal organic chemical vapor deposition. Note that the term "single crystal" as used in this embodiment means a crystal having a half width of a spectrum of 1,800 arcsec or less, which is obtained by measurement of an X-ray diffraction rocking curve. Such a first nitride semiconductor layer 21 is made of $Al_xGa_{1-x}N$ (0.5<X≤1), preferably AlN. The first nitride semiconductor layer 21 is made of a single crystal. Thus, the use of AlN having a lattice constant close to that of sapphire makes it easier to epitaxially grow the first nitride semiconductor layer 21, which is effective in improving the crystallinity of the second nitride semiconductor layer 22 to be mentioned later. The thickness of the first nitride semiconductor layer 21 is preferably 10 nm or more so as to be capable of sufficiently coating the entire upper surface of the sapphire substrate with the first nitride semiconductor layer 21, and 100 nm or less so as to improve the crystallinity of the first nitride semiconductor layer 21, more preferably 15 nm or more and 50 nm or less, and still more preferably 20 nm or more and 40 nm or less. In this way, the crystallinity of the first nitride semiconductor layer 21 can be further improved. The oxygen content of the first nitride semiconductor layer 21 is preferably 1% or more that can stably produce the +c polarity first nitride semiconductor layer 21, and about 10% or less that can improve the crystallinity of the second nitride semiconductor layer 22 laminated over the first nitride semiconductor layer 21. Note that the term "oxygen content of the first nitride semiconductor layer 21" as used herein is the concentration of oxygen contained in the layer deposited in a first step to be mentioned later.

The second nitride semiconductor layer 22 is a GaN layer that embeds therein the first nitride semiconductor layer 21, and particularly, has a flat crystal surface at the time of the initial growth, which can reduce the occurrence of dislocation in a third nitride semiconductor layer 23 to be mentioned later. Such a second nitride semiconductor layer 22 may have at least a thickness that can coat the first nitride semiconductor layer 21, for example, approximately 10 nm or more and 50 nm or less.

The third nitride semiconductor layer 23 (including the n-type semiconductor layer 13, light emission layer 14, and p-type semiconductor layer 15) is preferably formed using suitable material for the semiconductor light emitting element, for example, $In_xAl_yGa_{1-x-y}N$ (0≤X, 0≤Y, X+Y<1), etc. Each semiconductor layer included in the third nitride semiconductor layer 23 may have a single layer structure, but may also have a laminated structure with layers having different compositions and thicknesses, a superlattice structure, and the like. In particular, the light emission layer 14 preferably has a single quantum well or multiple quantum well structure including a stack of thin films causing a quantum effect.

The n-side electrode 16 and the p-side electrode 17 are connected to external electrodes, such as metal wires, and are members to be electrically connected to the third nitride semiconductor layer 23. The n-side electrode 16 is formed in connection with the n-type semiconductor layer 13 included in the third nitride semiconductor layer 23. The n-side electrode 16 can be formed using a single metal, for example, Ag, Al, Ni, Rh, Au, Cu, Ti, Pt, Pd, Mo, Cr, W, and the like, or an alloy containing the above metal as a principal component. Further, the n-side electrode 16 can be a single layer or a laminated layer formed using these metals. The p-side electrode 17 in this embodiment includes a transmissive electrode 17a and a pad electrode 17b. The transmissive electrode 17a is formed on the substantially entire upper surface of the p-type semiconductor layer 15 included in the third nitride semiconductor layer 23. The transmissive electrode 17a can be formed using transmissive conductive materials, such as indium tin oxide (ITO) or indium zinc oxide (IZO). The pad electrode 17b is formed over a part of the upper surface of the transmissive electrode 17a, and can be formed using the same metal materials as those of the n-side electrode 16.

A method for manufacturing the nitride semiconductor element 1 will be described below with reference to FIG. 1.

In the method for manufacturing the nitride semiconductor element 1, first, the first nitride semiconductor layer 21 of single crystals of $Al_xGa_{1-x}N$ (0.5<X≤1) is laminated on the sapphire substrate 11 by the metal organic chemical vapor deposition (hereinafter referred to as a first nitride semiconductor layer laminating step). After the first nitride semiconductor layer laminating step, the second nitride semiconductor layer 22 is laminated on the first nitride semiconductor layer 21 by the metal organic chemical vapor deposition (hereinafter referred to as a second nitride semiconductor layer laminating step).

Then, the n-type semiconductor layer 13, the light emission layer 14, and the p-type semiconductor layer 15 are laminated on or over the second nitride semiconductor layer 22 in that order by the metal organic chemical vapor deposition or the like to thereby form the third nitride semiconductor layer 23 (hereinafter referred to as a third nitride semiconductor layer laminating step).

Next, parts of the p-type semiconductor layer 15, light emission layer 14, and n-type semiconductor layer 13 located on the upper surface side of the third nitride semiconductor layer 23 are removed by etching to form an exposed region where the n-type semiconductor layer 13 is exposed at the bottom surface of the removed portion. Thereafter, by any well-known method in the related art, the n-side electrode 16 is formed on the exposed region of the n-type semiconductor layer 13, and the p-side electrode 17 is formed on the upper surface of the p-type semiconductor layer 15. The nitride semiconductor element 1 is thus manufactured.

Specifically, in this embodiment, the first nitride semiconductor layer laminating step includes a first step and a second step.

In the first step, the entire upper surface 110 of the sapphire substrate 11 is coated with an under nitride semiconductor layer 21a, while supplying oxygen, for example, at a flow rate of about 0.01 sccm or more and 0.1 sccm or less, and more preferably about 0.02 sccm or more and 0.06 sccm or less (note that the oxygen may be supplied by mixing oxygen into inert gas and supplying the mixed gas at a desired flow rate, or may be directly supplied at a desired flow rate). Thus, the first nitride semiconductor layer 21 having +c polarity can be stably grown, and the second nitride semiconductor layer 22 laminated on the first nitride semiconductor layer 21 can have a flat crystal surface. This is supposed to be because the addition of oxygen can suppress the first nitride semiconductor layer 21 from having the N polarity (−c polarity), thereby stably growing the first nitride semiconductor layer 21.

In the second step, crystals of an upper nitride semiconductor layer 21b are grown by supplying oxygen at a smaller flow rate than that of oxygen supplied in the first step, or without supplying the oxygen. Thus, the crystallinity of the first nitride semiconductor layer 21 can be improved, which also leads to improvement of the crystallinity of the second nitride semiconductor layer 22 laminated on the first nitride semiconductor layer 21 with the good crystallinity. Note that when decreasing the flow rate of oxygen supplied in the second step, the flow rate of oxygen maybe decreased in stages or continuously from the flow rate of oxygen supplied in the first step.

In the first nitride semiconductor layer laminating step, the first nitride semiconductor layer 21 is grown at a temperature of 800° C. or more. In this way, the first nitride semiconductor layer 21 can be surely growed into the single crystal state. Note that the growth temperature of the first nitride semiconductor layer 21 is preferably in a range of 800° C. to 1,300° C., and more preferably in a range of 900° C. to 1,200° C. This can reduce the damage to the upper surface 110 of the sapphire substrate 11 and can also grow the first nitride semiconductor layer 21 into the single crystal state. In contrast, when the growth temperature is larger than the upper limit, the upper surface 110 of the sapphire substrate 11 might be damaged. When the growth temperature is smaller than the lower limit, the first nitride semiconductor layer 21 cannot be growed into the single crystal state.

Examples of the first and second steps in the first nitride semiconductor laminating step will be described below with reference to FIG. 3. In the present Examples, three samples that are formed by changing the amount of supply of oxygen in the second step are provided, and a half width of an X-ray rocking curve (XRC-FWHM) of each sample is measured. Note that the upper surface of the sapphire substrate in the present examples has a plurality of conical protrusions and a flat surface of c-plane around these protrusions. A formation method of the protrusions in the present examples involves forming a pattern of a resist mask on an upper surface of the sapphire substrate in the similar shape as that of the bottom surface (in the circular shape in the present examples) of each protrusion to be formed, and then completely removing the patterned resist mask by dry etching. In this way, the protrusion can be formed.

Figure 3:
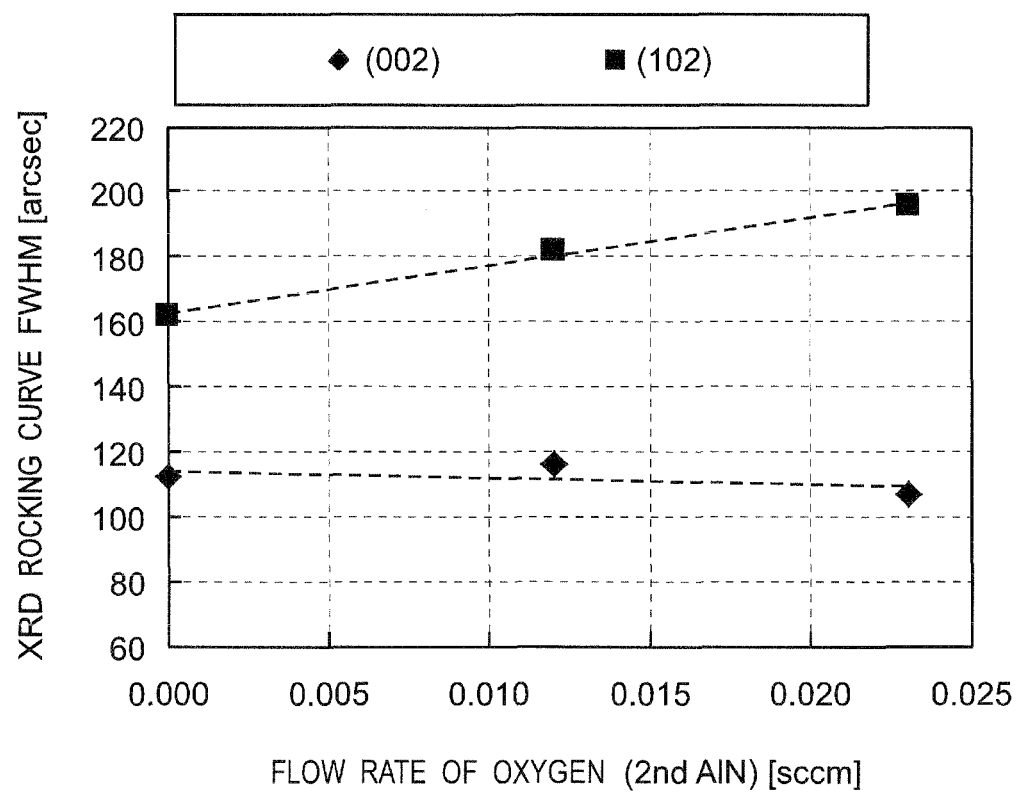
FIG. 3 is a graph showing the relationship between the flow rate of oxygen supplied in a second step of a first nitride semiconductor layer laminating step, and a half width of an X-ray diffraction rocking curve (XRD rocking curve FWHM) in a manufacturing procedure of the nitride semiconductor element in the one embodiment of the present invention.

Referring to FIG. 3, the first nitride semiconductor layer was made of AlN. In the first step, oxygen is mixed into inert gas, such as nitrogen or argon, whereby about 0.02 sccm of oxygen is supplied. Then, in the second step, oxygen is respectively supplied in 0 sccm, about 0.01 sccm, and about 0.02 sccm in the same way as the first step, thereby producing three samples with AlN layer of about 30 nm in thickness deposited on the sapphire substrate. Then, a GaN layer of about 5 μm in thickness is respectively deposited as the second nitride semiconductor layer over the AlN layer of each of the three samples, and thereafter each sample is measured for a full width at half maximum (FWHM) of an X-ray diffraction rocking curve (XRD rocking curve FWHM) of the GaN layer. At this time, Miller indexes (002) (102) of the GaN layer in each sample is also measured. In FIG. 3, a horizontal axis indicates the flow rate of oxygen supplied in the second step and a longitudinal axis indicates a half width of the X-ray diffraction rocking curve.

Although in the present examples, AlN is used for the first nitride semiconductor layer, the present invention is not limited thereto. Other suitable materials for the first nitride semiconductor layer that have the same tendency are considered to be material having a high mixed crystal ratio of Al, for example, $Al_xGa_{1-x}N$ (0.5<X≤1).

As shown in FIG. 3, in the Miller Index (102), as the flow rate of oxygen supplied in the second step is decreased, the half width of the X-ray diffraction rocking curve becomes smaller, and the crystallinity is improved. In the Miller index (002), the half width of the X-ray diffraction rocking curve becomes substantially constant, regardless of the flow rate of oxygen supplied in the second step. Thus, it is found that when the flow rate of oxygen supplied in the second step is smaller than that of oxygen supplied in the first step, the crystallinity of the GaN layer (second nitride semiconductor layer) can be improved.

The initial growth of the second nitride semiconductor layer will be described below with reference to FIGS. 4A and 4B.

Figure 4A:
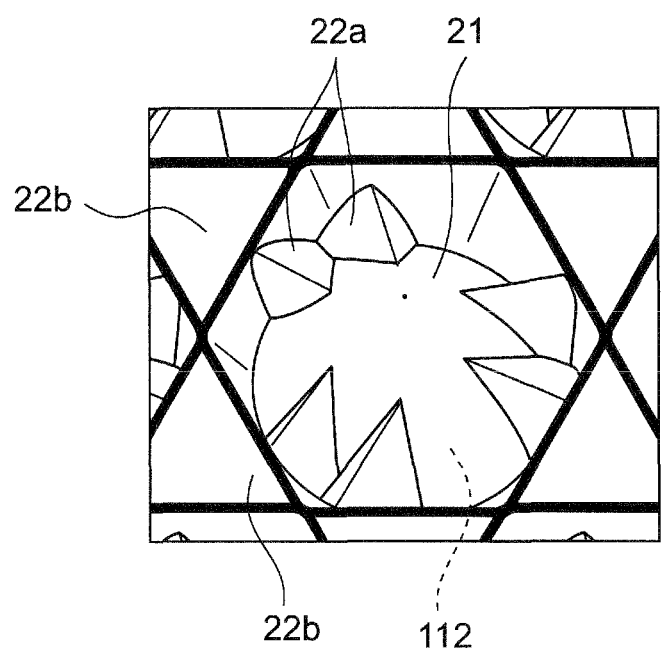
FIG. 4A is a schematic diagram viewed from the perspective direction for explaining an initial growth of a second nitride semiconductor layer in the one embodiment of the present invention.
Figure 4B:
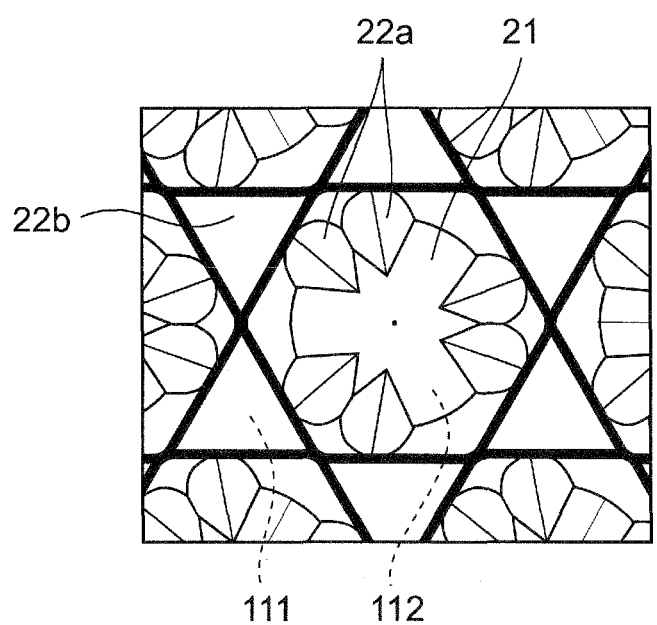
FIG. 4B is a schematic diagram viewed from the plane direction for explaining the initial growth of the second nitride semiconductor layer in the one embodiment of the present invention.

FIGS. 4A and 4B schematically show the state of initial growth, that is, the state in which the GaN layers 22a and 22b as the second nitride semiconductor layer are grown over the AlN layer 21 of single crystal as the first nitride semiconductor layer laminated on the entire upper surface 110 of the sapphire substrate 11 with the substantially conical protrusions 112.

As shown in FIGS. 4A and 4B, the GaN layers 22a and 22b in the initial growth grow on the single crystal AlN layer 21 from a part positioned on a flat surface 111 (c-plane) of the sapphire substrate 11, and from a part positioned near an n-plane at the side surface of the protrusion 112.

The presence of the GaN layers 22a grown in the positions near the n-plane promotes the formation of a stable hexagonal facet in such a manner that the GaN layers 22b are grown from the positions of the flat surface 111 positioned around the protrusion 112 so as to enclose the protrusion 112.

As a result, GaN layers 22b are grown from the positions of the flat surface 111 around the protrusion 112 so as to finally form one combined portion, which tends to reduce the dislocation caused in the GaN layer 22b. Thus, the sapphire substrate 11 has the substantially conical protrusions 112 on its upper surface 110, which can decrease the number of dislocations caused from the second nitride semiconductor layer. Note that in the present examples, the shape of the protrusion is substantially conical, but is not limited thereto. Alternatively, as long as an n-plane is formed in the vicinity of the side surface of the protrusion, the shape of the protrusion may be a substantially hexagonal pyramid.

Next, in Comparative Example, only the first step (by supplying oxygen at a flow rate of about 0.04 sccm) is performed to form an AlN layer 21 without carrying out the second step performed in the present example. In this case, the initial growth of the GaN layer 22c will be described below with reference to FIGS. 5A and 5B.

Figure 5A:
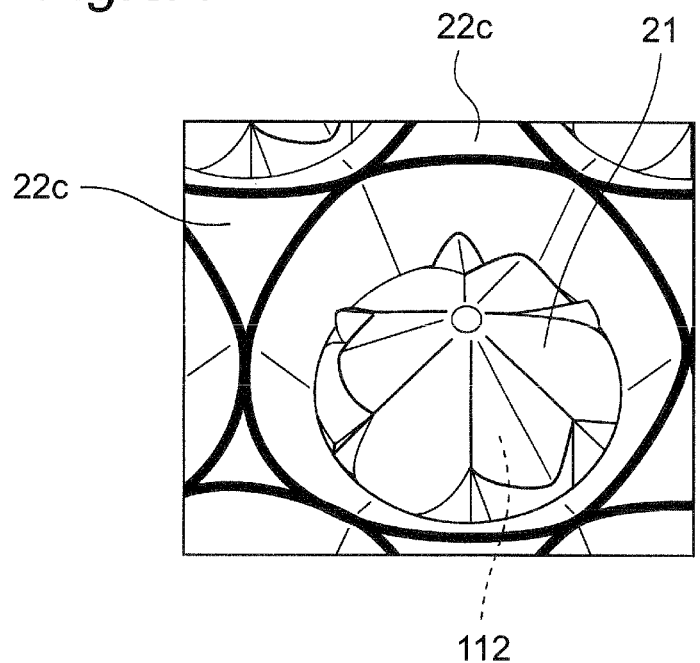
FIG. 5A is a schematic diagram viewed from the perspective direction for explaining an initial growth of a second nitride semiconductor layer in Comparative Example.
Figure 5B:
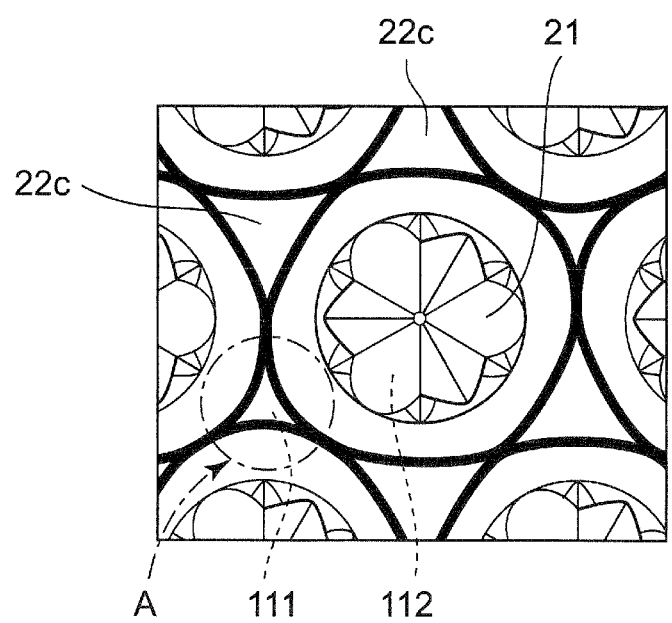
FIG. 5B is a schematic diagram viewed from the plane direction for explaining the initial growth of the second nitride semiconductor layer in Comparative Example.

As shown in FIGS. 5A and 5B, the facets of the GaN layers 22c tend to form an unstable deformed hexagonal shape. Thus, the GaN layers 22c have distorted parts with sides having different lengths and configuring the deformed hexagonal shape as illustrated by a part A in FIG. 5B. Thus, the GaN layers 22c are distorted when embedding the protrusions 112 therein, which would increase the dislocations as compared to the present examples.

The present invention is not limited to the above embodiments, and various modifications and changes can be made to those embodiments without departing from the scope of the present invention.

[Description of Reference Numerals]
1 Nitride semiconductor element
11 Sapphire substrate
110 Upper surface
111 Flat surface
112 Protrusion
13 n-type semiconductor layer
14 Light emission layer
15 p-type semiconductor layer
16 n-side electrode
17 p-side electrode
21 First nitride semiconductor layer
22 Second nitride semiconductor layer
23 Third nitride semiconductor layer

What is claimed is:

1. A method for manufacturing a nitride semiconductor element comprising:
   a step of laminating a first nitride semiconductor layer of single crystals of $Al_xGa_{1-x}N$ ($0.5<X\leq1$) on an upper surface of a sapphire substrate by a metal organic chemical vapor deposition; and
   a step of laminating a second nitride semiconductor layer on the first nitride semiconductor layer,
   wherein the step of laminating the first nitride semiconductor layer includes:
   a first step of coating an entire upper surface of the sapphire substrate with an under nitride semiconductor layer while supplying oxygen, and
   a second step of growing an upper nitride semiconductor layer while supplying oxygen at a smaller flow rate than that of oxygen supplied in the first step, or without supplying oxygen.

2. The method for manufacturing a nitride semiconductor element according to claim 1, wherein in the step of laminating the first nitride semiconductor layer, the first nitride semiconductor layer is grown at a temperature of 800° C. or more.

3. The method for manufacturing a nitride semiconductor element according to claim 1, wherein the upper surface of the sapphire substrate includes a flat surface of a c-plane and a protrusion projected from the flat surface, and the shape of the protrusion is substantially conical, or substantially hexagonal pyramid having a side surface of an n-plain.

4. The method for manufacturing a nitride semiconductor element according to claim 1, wherein the step of laminating the first nitride semiconductor layer and the step of laminating the second nitride semiconductor layer are continuously performed by the metal organic chemical vapor deposition.

5. The method for manufacturing a nitride semiconductor element according to claim 1, wherein the first nitride semiconductor layer is made of AlN.

6. The method for manufacturing a nitride semiconductor element according to claim 1, wherein the second nitride semiconductor layer is made of GaN.

* * * * *